United States Patent
Goodner et al.

(10) Patent No.: US 7,790,630 B2
(45) Date of Patent: Sep. 7, 2010

(54) SILICON-DOPED CARBON DIELECTRICS

(75) Inventors: Michael D. Goodner, Hillsboro, OR (US); George A. Antonelli, Portland, OR (US)

(73) Assignee: Intel Corporation, Santa Clara, CA (US)

(*) Notice: Subject to any disclaimer, the term of this patent is extended or adjusted under 35 U.S.C. 154(b) by 468 days.

(21) Appl. No.: 11/105,036

(22) Filed: Apr. 12, 2005

(65) Prior Publication Data

US 2006/0226516 A1    Oct. 12, 2006

(51) Int. Cl.
*H01L 21/469*    (2006.01)
(52) U.S. Cl. .................... 438/780; 257/E21.27
(58) Field of Classification Search ........... 438/482, 438/FOR. 260, 781, 778, 758, 780; 257/E21.27
See application file for complete search history.

(56) References Cited

U.S. PATENT DOCUMENTS

| | | | | |
|---|---|---|---|---|
| 3,542,830 A * | 11/1970 | Kim et al. | ............... | 556/427 |
| 4,495,262 A * | 1/1985 | Matsuzaki et al. | ......... | 430/57.5 |
| 5,569,487 A * | 10/1996 | DeVre et al. | ................ | 427/81 |
| 5,602,060 A * | 2/1997 | Kobayashi et al. | .......... | 438/781 |
| 5,771,873 A * | 6/1998 | Potter et al. | ................ | 123/668 |
| 6,165,256 A * | 12/2000 | Hayakawa et al. | ............ | 106/13 |
| 6,495,479 B1 * | 12/2002 | Wu et al. | .................... | 438/781 |
| 6,548,892 B1 * | 4/2003 | Steiner et al. | .............. | 257/701 |
| 6,552,152 B2 * | 4/2003 | Sakano et al. | ................ | 528/42 |
| 6,599,634 B2 * | 7/2003 | Yoneda et al. | .............. | 428/447 |
| 6,617,040 B2 * | 9/2003 | Houser et al. | ............... | 428/447 |
| 6,696,538 B2 * | 2/2004 | Ko et al. | ....................... | 528/34 |
| 6,780,517 B2 * | 8/2004 | Chen et al. | .................. | 428/447 |
| 6,784,119 B2 * | 8/2004 | Gaillard et al. | ............ | 438/780 |
| 6,818,309 B1 * | 11/2004 | Talpaert et al. | ............. | 428/432 |
| 6,855,645 B2 * | 2/2005 | Tang et al. | .................. | 438/778 |
| 7,214,600 B2 * | 5/2007 | Won et al. | ................... | 438/485 |
| 2003/0194496 A1 * | 10/2003 | Xu et al. | ................ | 427/255.28 |
| 2003/0216058 A1 * | 11/2003 | Ko et al. | ..................... | 438/781 |
| 2003/0219973 A1 * | 11/2003 | Townsend et al. | .......... | 438/631 |
| 2004/0152334 A1 * | 8/2004 | Ohto et al. | .................. | 438/758 |
| 2004/0156987 A1 * | 8/2004 | Yim et al. | ................ | 427/255.6 |
| 2006/0006140 A1 * | 1/2006 | Lakshmanan et al. | ........ | 216/67 |
| 2006/0079099 A1 * | 4/2006 | Nguyen et al. | ............. | 438/789 |
| 2006/0091559 A1 * | 5/2006 | Nguyen et al. | ............. | 257/775 |
| 2007/0021580 A1 * | 1/2007 | Nakagawa et al. | ........... | 528/34 |

FOREIGN PATENT DOCUMENTS

JP    03101123 A  *  4/1991

OTHER PUBLICATIONS

T.I.T. Okpalugo, The effect of silicon doping and thermal annealing on the electrical and structural properies of hydrogenated amorphous carbon thin films, Diamond and related Materials 13 (2004)1549-1552 (Available online Dec. 31, 2003).*

* cited by examiner

*Primary Examiner*—W. David Coleman
*Assistant Examiner*—Latanya Crawford
(74) *Attorney, Agent, or Firm*—Blakely, Sokoloff, Taylor & Zafman LLP

(57) ABSTRACT

A silicone-doped carbon interlayer dielectric (ILD) and its method of formation are disclosed. The ILD's dielectric constant and/or its mechanical strength can be tailored by varying the ratio of carbon-to-silicon in the silicon-doped carbon matrix.

9 Claims, 7 Drawing Sheets

SILICON-DOPED CARBON DIELECTRICS

FIELD OF THE INVENTION

Embodiments of the present invention relate generally to semiconductor technology and more specifically to semiconductor device interlayer dielectrics.

BACKGROUND OF THE INVENTION

The reduction of semiconductor device dimensions has increased the density of semiconductor circuitry to a point where interconnect line-to-line capacitance can impact the speed (due to propagation delay) and reliability (due to crosstalk noise) of semiconductor devices. Manufacturers are addressing this is by incorporating changes to semiconductor device fabrication processes. One such change includes converting interlayer dielectrics (ILDs) from silicon dioxide-based ($SiO_2$-based) materials (i.e., conventional $SiO_2$, which has a dielectric constant of approximately 3.9-4.2 and fluorinated silicon dioxide, which has a dielectric constant of approximately 3.5) to alternative low dielectric constant (low-k) materials. Decreasing the ILD's dielectric constant decreases line-to-line capacitance and its associated effects on device performance.

Carbon-doped oxides (CDOs) are one alternative being investigated to replace $SiO_2$-based ILDs. FIG. 2 illustrates an example of a carbon-doped oxide molecular network 20. The network 20 includes atoms of silicon 22, oxygen 24, and hydrogen 26, as well as carbon-containing groups 28. CDO dielectrics such as this can be deposited by way of plasma enhanced chemical vapor deposition (PECVD) using precursors such as dimethyldimethoxysilane (DMDMOS), diethoxydimethylsilane (DEMS), and octamethylcyclotetrasiloxane (OMCTS).

In carbon-doped oxide networks 20, methyl groups 28 and hydrogen atoms 26 do not contribute to intermolecular network bonding. Voids that are produced as a result of this contribute to lowering the ILD's dielectric constant. The reduction in intermolecular network bond also reduces the ILD's modulus of elasticity (i.e., one measure of the ILD's mechanical strength). So, while CDO ILDs may have lower dielectric constants as compared to $SiO_2$-based ILDs, they are also mechanically weaker (modulus of elasticity of CDO approximately equal to 15 GPa; modulus of elasticity of $SiO_2$ approximately equal to 60-70 GPa).

Low modulus of elasticity materials are more susceptible to deformation or damage when subject to compressive, tensile, and sheer stresses. Inability to withstand these stresses during subsequent manufacturing processes, such as chemical mechanical planarization, die singulation, wafer probe, wire bond, die attach, etc., limits their attractiveness because expensive and time consuming process/retooling changes may be required in order to accommodate them.

Figure 1:
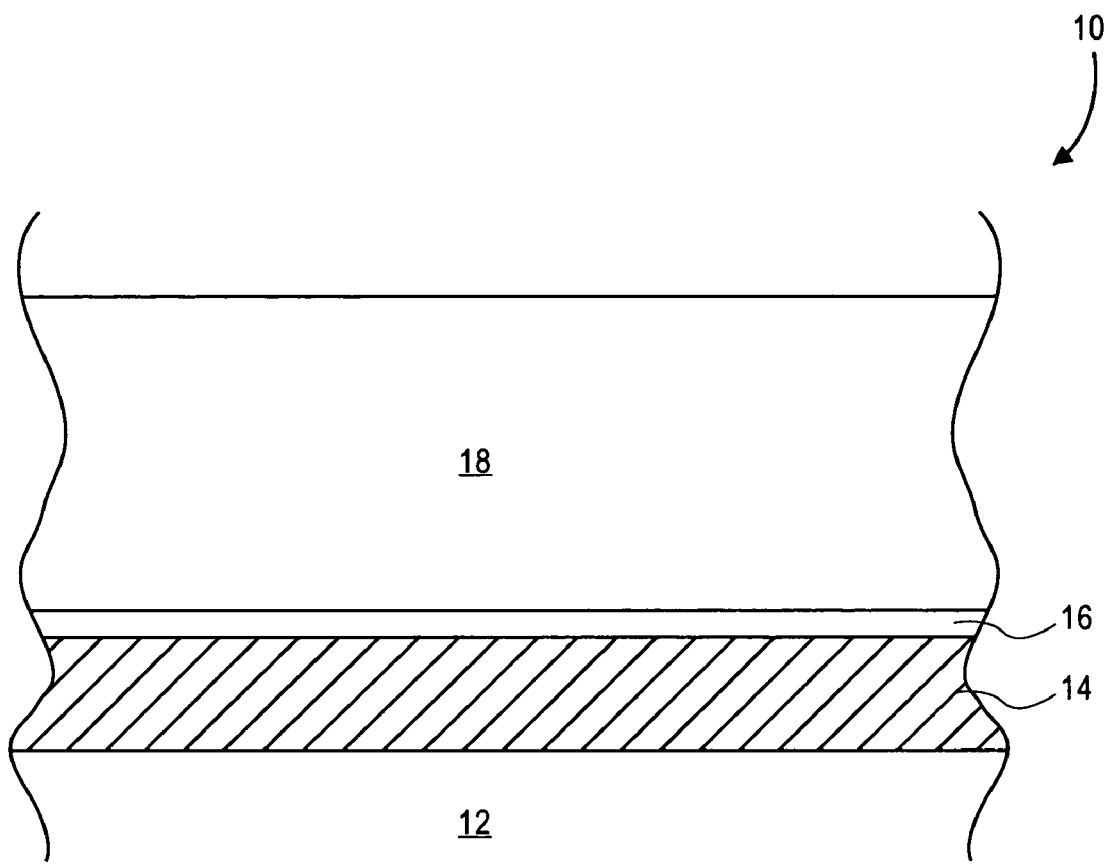
FIG. 1 illustrates a cross-sectional view of a partially fabricated semiconductor device that includes an interlayer dielectric (ILD).

It will be appreciated that for simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, an ILD composition and precursors for forming it are disclosed. Reference is made to the accompanying drawings within which are shown, by way of illustration, specific embodiments by which the present invention may be practiced. It is to be understood that other embodiments may exist and that other changes may be made without departing from the scope and spirit of the present invention.

The terms on, above, below, and adjacent as used herein refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

Figure 3:
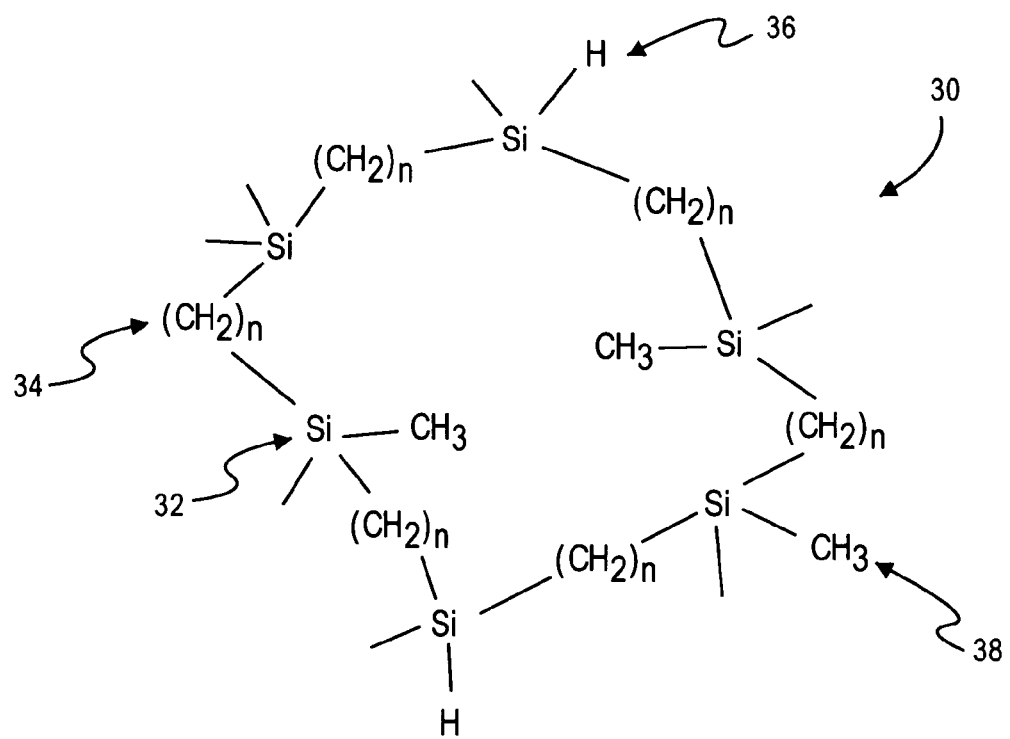
FIG. 3 illustrates a silicon-doped carbon network in accordance with an embodiment of the present invention.

In accordance with one or more embodiments of the present invention, low-k ILDs, their use, and precursors for forming them are disclosed. In one embodiment, the low-k ILD is formed from a silicon-doped carbon (SDC) material that can have better dielectric and/or mechanical properties than that of $SiO_2$-based materials and similar or better dielectric and/or mechanical properties than that of CDOs. These embodiments and variations thereof may be better understood with respect to FIGS. 1 and 3-15, in which: (1) FIGS. 1 and 12-15 illustrate, in cross-sectional diagrams, formation of an interconnect using a silicon-doped carbon ILD; (2) FIG. 3 illustrates an example of a silicon-doped carbon molecular network that can be used as an ILD; and (3) FIGS. 4-11 illustrate examples of types of precursors that can be used to form silicon-doped carbon ILDs.

Shown in FIG. 1 is an illustration of a partially fabricated semiconductor device 10. The semiconductor device 10 includes one or more base layers 12. Under the base layers 12 is a substrate (not shown) which is typically a semiconductor wafer. The substrate's material typically includes silicon, silicon germanium, gallium arsenide or other III-V compounds, silicon carbide, silicon on insulator (SOI), or the like.

The multi-layered region (base layers) 12 typically includes a combination of dielectric, semiconductive, and/or conductive layers that have been photolithographically patterned and etched to form semiconductor device structures over, on, or within the substrate. For example, region 12 may include one or more of various dielectric layers such as silicon nitride, silicon dioxide, tetraethylorthosilicate (TEOS), borophosphosilicate glass (BPSG), spin on glass (SOG), low-k materials, high-k materials, or the like. The region 12 may also contain semiconductive features that include one or more of epitaxial silicon, polysilicon, amorphous silicon, doped polysilicon, or the like. In addition, the multi-layer region 12 can also include conductive features or metallic layers that include one or more of refractory silicides, refractory metals, aluminum, copper, alloys of these materials, conductive nitrides, conductive oxides, or the like.

Overlying region 12 is a conductive structure 14. The conductive structure 14 can be an interconnect, a conductive plug, or the like. The conductive structure 14 can include adhesion layers, barrier layers, seed layers and conductive fill materials formed from materials that include refractory metals, silicides, aluminum, copper, conductive nitrides, conductive oxides, alloys of these materials, or the like. Conductive structure 14 may be electrically connected to some portions of region 12 and electrically insulated from other portions of region 12. Overlying the conductive structure 14 is an optional etch stop layer (ESL) 16. The etch stop layer 16 typically, but not necessarily, includes one or more of titanium nitride, silicon nitride, silicon oxynitride, or a silicon-rich-silicon-nitride. The etch stop layer can be deposited using chemical vapor deposition (CVD) or plasma enhanced chemical vapor deposition (PECVD).

Figure 2:
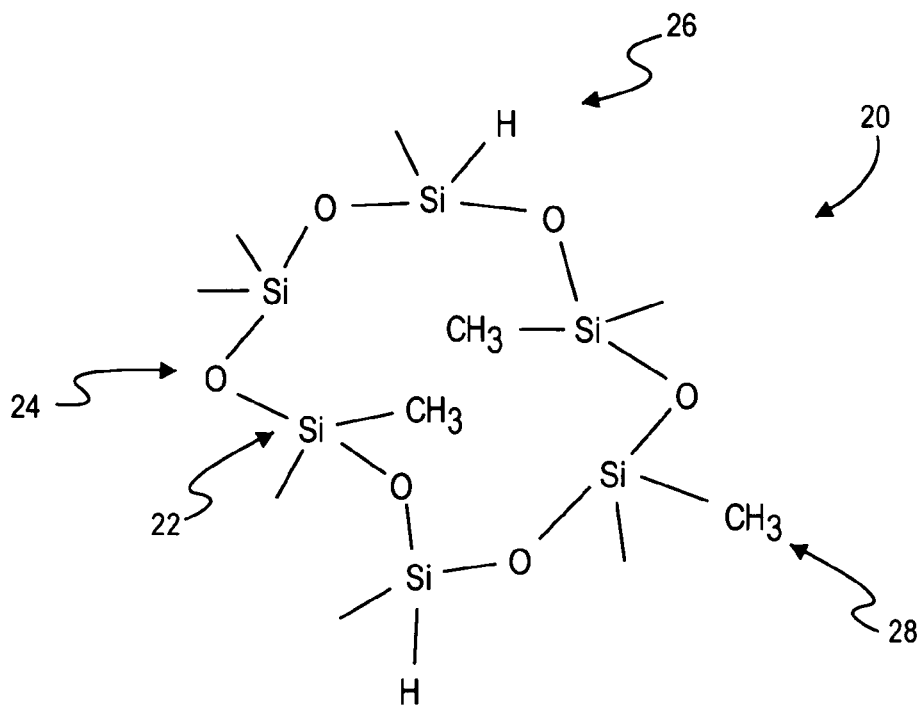
FIG. 2 illustrates an example of a carbon-doped oxide network for use as an ILD.

Over the etch stop layer 16 is an interlayer dielectric (ILD) 18. In accordance with one embodiment, the ILD 18 is a silicon-doped carbon (SDC) dielectric material. Unlike the CDO of FIG. 2, the silicon-doped carbon dielectric disclosed herein can include carbon-containing groups in locations occupied by oxygen in the CDO. Turning now to FIG. 3, in accordance with one embodiment, an example silicon-doped carbon network 30 is illustrated. As can be seen from FIG. 3, the silicon-doped carbon network 30 may be intrinsically microporous due to the presence of terminal carbon-containing groups 38 and hydrogen atoms 36 (similar to the case of carbon-doped oxides). However, unlike the carbon-doped oxide which includes only a relatively low density of carbon (typically less than 20 atomic percent, and often less than 10 atomic percent), the silicon-doped carbon network 300 here is a carbon-based film (i.e., predominantly carbon) that has been doped with silicon atoms 32. Consequently, its backbone includes chains of —$(CH_2)$n-Si—$(CH_2)$n- (as opposed to carbon-doped oxides which have backbones that include —O—Si—O—).

Furthermore, unlike organic polymer ILDs (not shown), which primarily include only carbon and hydrogen, the silicon-doped carbon material disclosed herein incorporates silicon into the ILD's network. The presence of silicon in the SDC contributes to increasing the films mechanical strength. The number of carbons and length of the $(CH_2)$n chains contributes to a determination of the ILD's dielectric constant and density. The ILD's physical and electrical characteristics can therefore be tuned for specific applications by varying the amount of silicon in the network, the relative number of $(CH_2)$n chains associated with each silicon atom, and the length of the $(CH_2)$n links between the silicon atoms. In one embodiment, the number of $CH_2$ groups in the chain is increased so that the silicon's atomic percent is less than 25%. In an alternative embodiment, the number of $CH_2$ groups in the $(CH_2)$n chain is increased so that the silicon's atomic percent is less than 15%. At these concentrations, the dielectric constant should be in a range of approximately 2.5-2.0.

Figure 4:
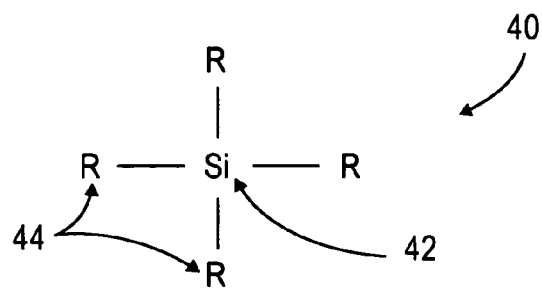
FIG. 4 illustrates the general structure of a PECVD precursor for use in silicon-doped carbon ILD deposition.

Methods for depositing silicon-doped carbon ILDs can vary. They can include spin-on and chemical vapor deposition (CVD). A number of CVD precursors can be used for forming silicon-doped carbon films. A basic precursor is shown in FIG. 4, where a central silicon atom 42 is bonded to four side groups 44. One of more of these side groups 44 can contain reactive groups that produce reactive sites (free radicals) that can carbon-carbon cross link with other precursors. To the extent that reactive sites on all four side groups cross-link with other precursors, the mechanical strength of the ILD can increase. Reactive groups can include, for example, double-bonded carbon groups or halogens, (e.g., chlorine or fluorine). Free radical formation and precursor carbon-carbon cross-linking can occur in the plasma or upon exposure to an electromagnetic energy source (e.g., e-beam or ultra-violet (UV) radiation) either during deposition or post-deposition.

In accordance with one embodiment, the ILD 18 is deposited using pulsed plasma enhanced CVD (PECVD). While the pulse is turned on, precursor reactive sites are generated in the plasma. Then, after the pulse is turned off, precursor reactive sites can react with each other, thereby forming the Si—$(CH_2)$n-Si bridges (carbon bridges between precursors). Additional reactants may also be utilized during the deposition or post-treatment steps to further modify the deposited film's composition. For example, hydrogen gas ($H_2$) can be added during deposition or post-treatment to promote saturation of the carbon bonds and increase long-term film stability. FIGS. 5-11 further illustrate exemplary precursors that can be used to form silicon-doped carbon films.

Figure 5:
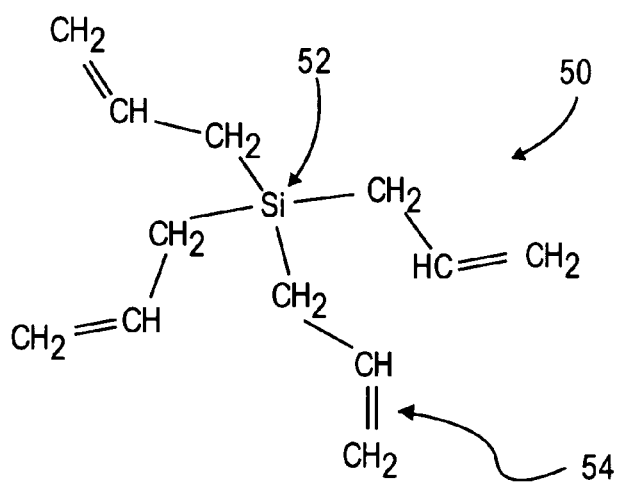
FIGS. 5-11 illustrate examples of precursors for use in silicon-doped carbon ILD deposition.
Figure 6:
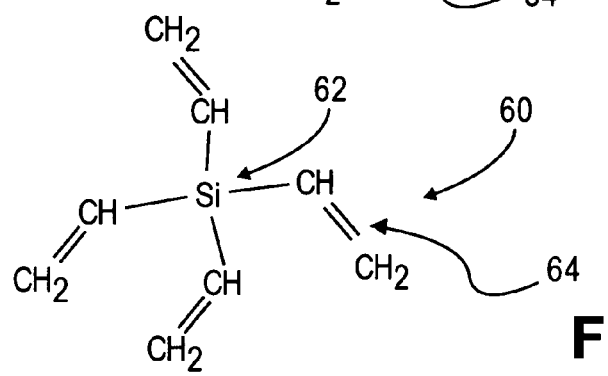

Shown in FIGS. 5 and 6 are tetraallylsilane 50 and tetravinylsilane 60, respectively. Tetraallylsilane ($C_{12}H_{20}Si$) and tetravinylsilane ($C_8H_{12}Si$) both comprise central silicon atoms 52 and 62 that have four side chains, each of which include double bonded carbon groups 54 and 64. Because all the double bonded carbon groups 54 and 64 can be used to form sites that react with other precursors during ILD formation (i.e. during deposition or post-treatment), precursors 50 and 60 are capable of providing for the highest density of silicon cross-linking (i.e. four separate $(CH_2)$n chains can be produced per silicon atom). This can correspondingly lead to increased mechanical strength.

Because the tetraallylsilane 50 precursor has a larger number of carbons in each side chain as compared to tetravinylsilane, it may lead to the formation of a silicon-doped carbon network that is mechanically weaker (due to less silicon cross linking—i.e., a greater number of carbon atoms between silicon cross links), but which has an improved dielectric constant (i.e. a decreased dielectric constant due to a lower overall silicon content). The tradeoff between mechanical strength and dielectric constant can be optimized using a blend of precursors tailored to achieve the desired results.

Figure 7:
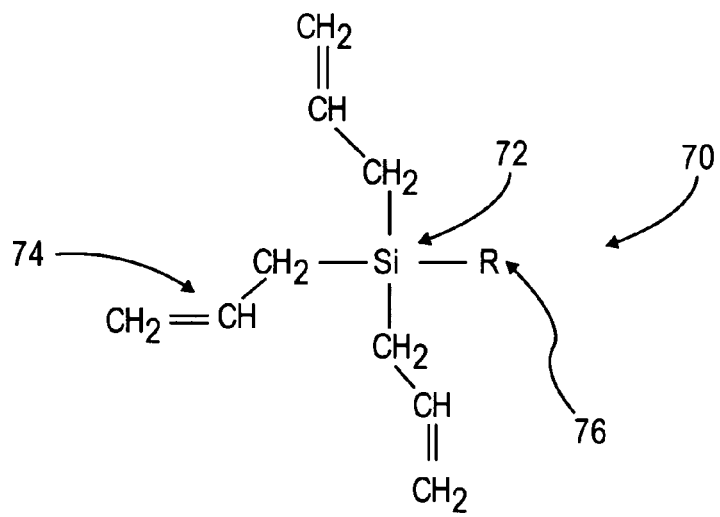

FIG. 7 illustrates an example of a precursor that can be used to form silicon-doped carbon films in accordance with an alternative embodiment of the present invention. In this embodiment, the precursor includes both non-reactive alkyl groups and reactive double bond sites for carbon bridge formation. For example, for R equal to $CH_3$, the precursor 70 shown in FIG. 7 is triallylmethylsilane ($C_{10}H_{18}Si$). The precursor 70 is similar to the precursor 50 of FIG. 5 except instead of four side chains that include reactive groups (i.e. double bonds or other groups capable of facilitating carbon-bridge formation) attached to a central silicon atom 72, only three side chains with reactive groups 74 are present. The fourth side chain has been replaced by an alkyl group 76 (in this case, a methyl group). Like the precursors 50 and 60 (FIGS. 5 and 6) broken double bonds formed as the result of the exposure to the PECVD environment can serve as sites whereby reactions with other precursors can occur during ILD formation. The methyl group, however, which is less reactive than the double bonded carbon, will have a higher probability being incorporated into the silicon-doped carbon ILD film. Alkyl group inclusion restricts intermolecular bonding in the network and can introduce microporosity into the silicon-doped carbon network by way of matrix disruption, thereby further contributing to reducing the film's dielectric constant and density.

Figure 8:
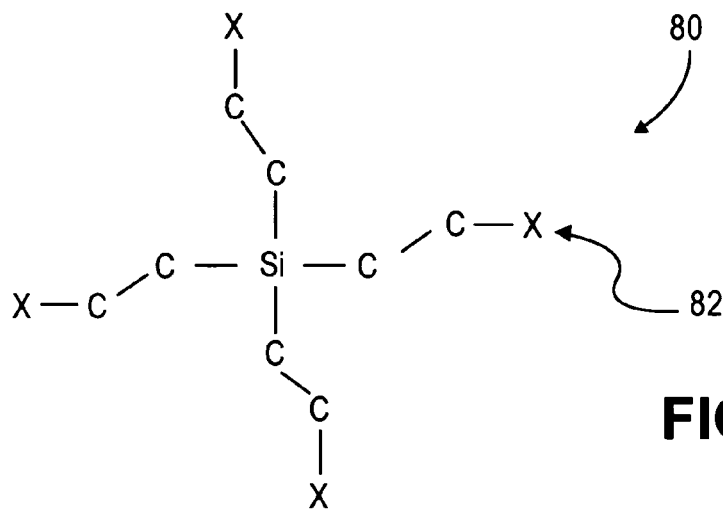

FIG. 8 illustrates an example of a precursor that can be used to form silicon-doped carbon films in accordance with an alternative embodiment of the present invention. In this embodiment, the precursor includes side chains that contain terminal halogens (fluorine, chlorine, etc). An example of such a precursor is the precursor 80 shown in FIG. 8 otherwise known as tetra(2-haloethyl)silane (note that for ease of illustration/discussion hydrogen atoms are not shown in the precursors of FIGS. 8-11). During PECVD deposition, the reactivity of the halogens 82 is such that they are easily dissociated when exposed to the plasma. Upon dissociation, reactive carbon radicals are generated that can link with other precursors thereby forming the ILD.

Figure 9:
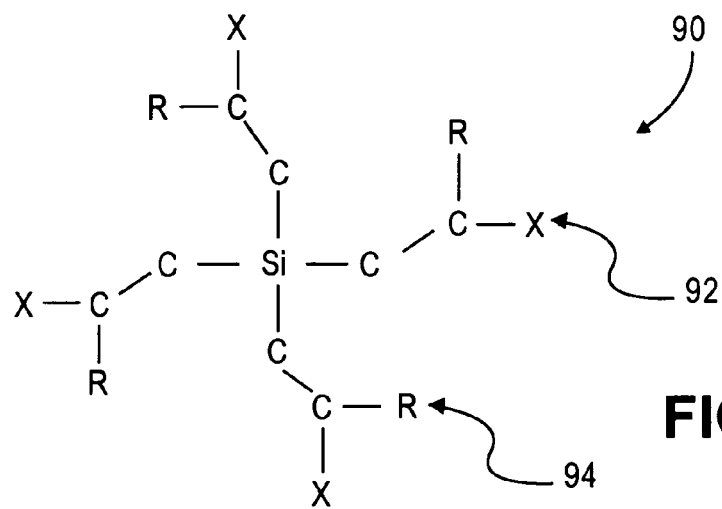

FIG. 9 illustrates an example of a precursor that can be used to form silicon-doped carbon films in accordance with an alternative embodiment of the present invention. In this embodiment, the precursor includes non-terminal reactive groups. An example of such a precursor is the precursor 90 shown in FIG. 9 otherwise known as tetra (2-halopropyl) silane. Upon dissociation of the non-terminal halogens 92, carbon radicals are produced which can form carbon bridges that have dangling carbon-containing groups 94 (here, methyl groups hanging off carbons in the bridge). Note that in some cases however, radicals can migrate via hydrogen abstraction to the terminal position. In which case, there may be no carbon-containing groups dangling from the carbon chain. To the extent that carbon-containing groups do attach to side chains in the ILD network, they can contribute to increasing microporosity and lowering the dielectric constant of the ILD via matrix disruption.

Figure 10:
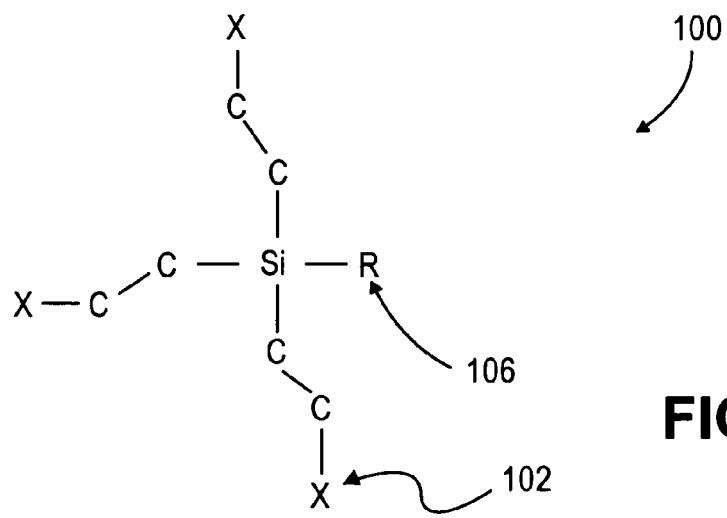

FIG. 10 illustrates an example of a precursor that can be used to form silicon-doped carbon films in accordance with an alternative embodiment of the present invention. In this embodiment, the precursor includes non-reactive alkyl groups and reactive halogen sites. For example, for R equal to $CH_3$, the precursor 100 shown in FIG. 10 is tri (2-haloethyl) methylsilane, which contains three terminal halogens 102 and a methyl group 106 directly attached to a silicon atom 104. Carbon-carbon cross linking can occur at reactive sites generated by dissociation of the halogens 102 and the less-reactive alkyl group 106 will likely be incorporated into the ILD because it is directly attached to the silicon atom 104. The presence of alkyl groups in the ILD contribute to increasing its microporosity and lowering its dielectric constant.

Figure 11:
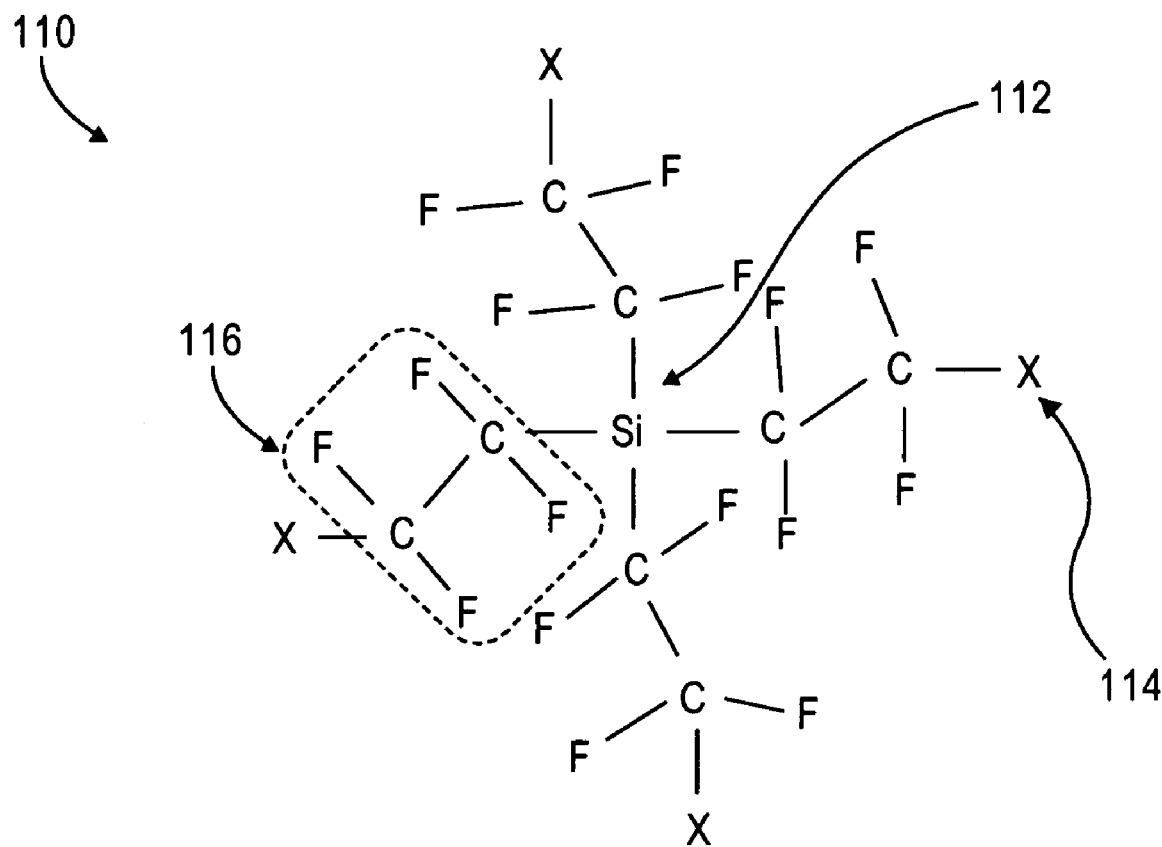

FIG. 11 illustrates an example of a precursor that can be used to form silicon-doped carbon films in accordance with an alternative embodiment of the present invention. In this embodiment, the precursor includes terminal halogen reactive sites and fluorinated carbon moieties. An example of such a precursor is the precursor 110 shown in FIG. 11 otherwise known as tetra(2-haloperfluoroethyl)silane, which contains multiple halogenated sites 114 on each of the branched side chains attached to a silicon atom 112 and each side chain additionally includes a perfluorinated carbon moiety 116. In embodiments, where X denotes the presence of a chlorine atom, the chlorine may preferentially dissociate in the plasma, thereby producing terminal reactive sites. In embodiments where X denotes the presence of a fluorine atom, then dissociation can alternatively occur at any one of the fluorine-containing sites. In either case, the carbon bridges between silicon atoms can now also become fluorinated via the presence of the perfluorinated carbon moieties, thereby leading to a further reduction in the films dielectric constant. It should be noted that fluorine-containing films such as this can be damaged during subsequent plasma etching, in which case F— and/or HF can be generated. Therefore etching conditions may require optimization to prevent this damage. Such optimization can include the use of a low power or low temperature during etching to prevent the penetration of plasma into the film or a brief thermal treatment after etching to degas any F— or HF produced.

In addition to the aforementioned precursors, mixtures thereof can also be used to deposit silicon-doped carbon films. In addition, other precursors, for example organic precursors that include carbon and hydrogen, double bonded carbon, and/or halogenated sites, can be co-deposited with the aforementioned precursors to increase the film's carbon content, promote carbon-carbon cross linking, and/or to increase the length of carbon chains between adjacent silicon atoms. Suitable precursors here could include those containing terminal vinyl groups (e.g., ethylene or 1,3-butadiene), terminal methyl groups and at least one vinyl group (e.g., propylene or 2-butene), terminal halogen sites (e.g., 1,2-difluoroethane), non-terminal halogen sites, multiple halogens, or combinations of these functionalities.

Turning now to FIGS. 12-15, an example embodiment is disclosed showing formation of a dual-damascene interconnect opening in the ILD 18. This embodiment is intended to show one aspect of how silicon-doped carbon ILDs can be beneficial during the semiconductor fabrication process. One of ordinary skill appreciates that this aspect is but one example of how the silicon-doped carbon ILD can be used. And, that its use as an ILD (or dielectric) for other applications (e.g., as a passivation layer, for gap fill, as an etch-stop or barrier layer, for single damascene interconnects, or for dual damascene interconnects formed using other techniques, etc.) may provide similar or other advantages.

Figure 12:
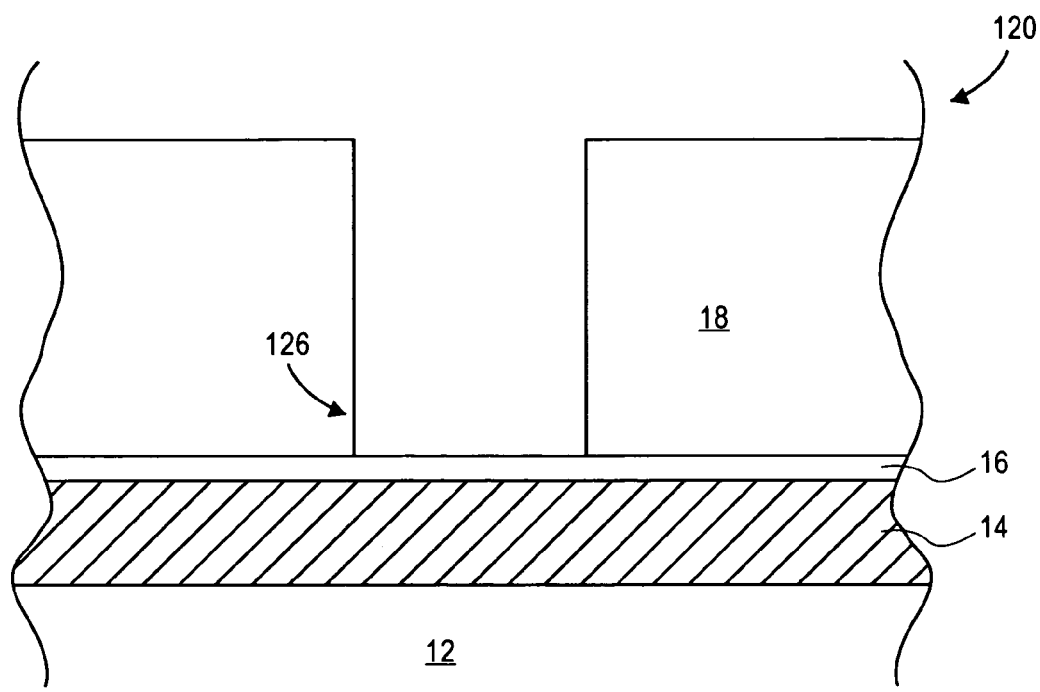
FIGS. 12-15 illustrate, in cross-sectional diagrams, formation of an interconnect using a silicon-doped carbon ILD.

In FIG. 12, a cross-section 120 of the partially fabricated semiconductor device of FIG. 1 is illustrated after forming via opening 126 in the ILD 18. The ILD 18 is a silicon-doped carbon film that may have been formed using one or more of the embodiments disclosed herein. To the extent that the ILD 18 has properties similar to conventional SiO2, then resist patterning, ILD etching, and resist removal all can be accomplished using conventional processes. As shown in FIG. 12, etching to form via opening 126 typically terminates on or in the etch stop layer 16 (or on the underlying conductive layer in the absence of the etch stop layer).

Figure 13:
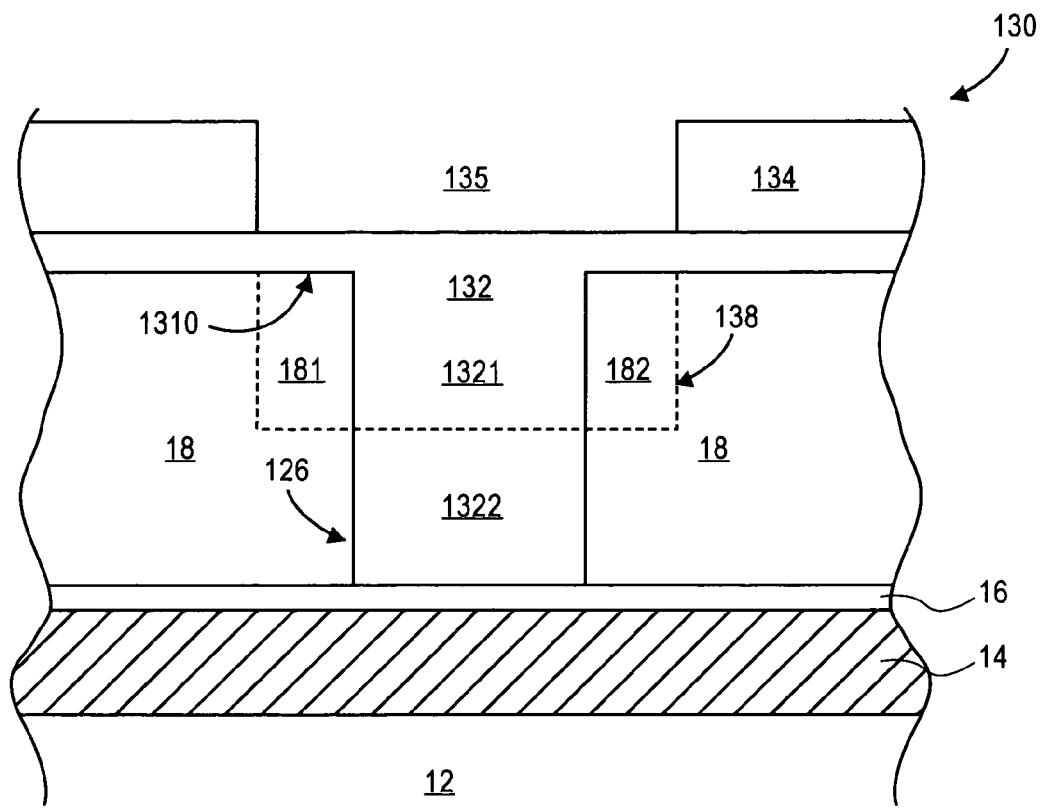

Turning now to FIG. 13, a cross-sectional view 130 of the partially fabricated semiconductor device of FIG. 12 is shown after an antireflective/fill material 132 is formed over ILD 18 and within via opening 126. The antireflective/fill material 132 (known alternatively as a bottom-antireflective coating (BARC) or a sacrificial light absorbing material (SLAM)) preferably (but not necessarily) (1) has a high optical absorption at the exposure wavelength used during lithography process to define the trench patterns, (2) uniformly fills the via opening 126 and has an etch rate that is comparable to the silicon-doped carbon ILD 18 etch rate, (3) has good selectivity to the photoresist 134 during the trench etch process, and (4) is compatible with the trench lithographic process (i.e., the trench photoresist coat, patterning, developing, or cleaning processes).

Resist layer 134 has been deposited overlying antireflective/fill material 132 and patterned to form a resist opening 135 that exposes portions of antireflective/fill material 132. Portions of antireflective/fill material 132 exposed by the resist opening 135 can then be removed using, for example, a plasma etch process. Initially, the etch removes only antireflective/fill material 132 exposed by the opening 135. Upon reaching the upper surface 1310 of the ILD 18, ILD portions 181, 182, and antireflective/fill material portions 1321 are etched until a trench opening (here approximated by the dashed line 138) is formed. After forming the trench opening 138, resist layer 134 can be removed using conventional ash or wet clean processes (to the extent that compatible with the silicon-doped carbon ILD 18). After the resist 134 is removed, the substrate is typically cleaned again to remove unremoved portions 1322 of anti antireflective/fill material 132. Normally, this clean is performed using hydrofluoric (HF) acid-based or other similar fluoride-containing solutions (to the extent they are compatible with the silicon-doped carbon ILD 18).

Figure 14:
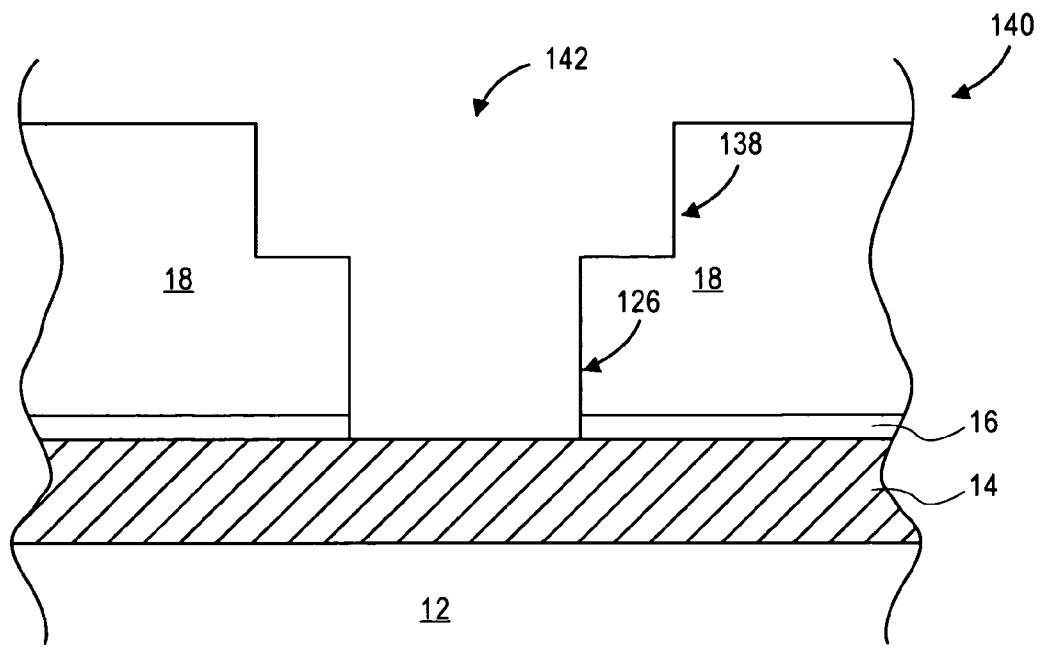

Turning now to FIG. 14, a cross-sectional view 140 of the partially fabricated semiconductor device of FIG. 13 is shown after the remaining portions 1322 of the antireflective-fill material (shown in FIG. 13) and portions of the optional ESL 16 have been removed. The optional ESL 16 can be removed using a conventional plasma etch process and exposed conductive material 144 can then be cleaned using conventional processing. At this point, a dual-damascene opening 142 that includes a via portion 126 and a trench portion 138 has been formed in the ILD 18.

Figure 15:
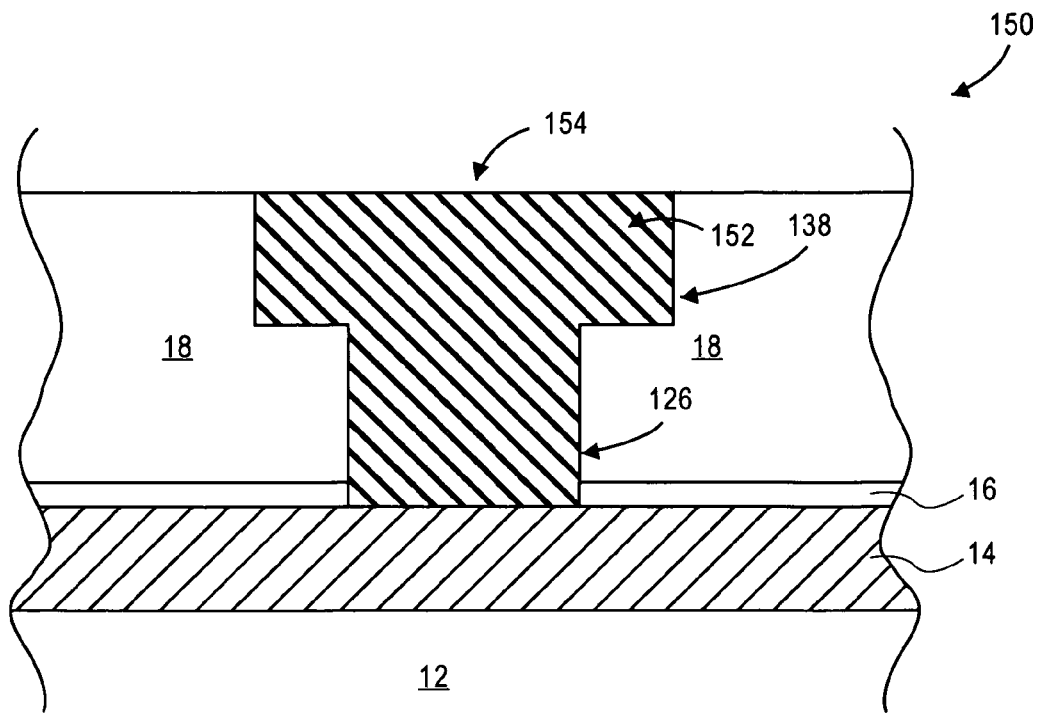

Turning now to FIG. 15, a cross-sectional view 150 of the partially fabricated semiconductor device of FIG. 14 is shown after conductive material 152 has been deposited in trench 138 and via 126 and a dual-damascene interconnect 154 has been formed. The conductive material 152 can include: (1) barrier layers, such as tantalum nitride (TaN), titanium nitride (TiN), titanium tungsten (Ti/W), composites thereof, or the like; (2) seed layers that comprise copper, metallic, or copper-alloy seed materials; and (3) bulk conductive materials, that can include copper, aluminum, or alloys of copper or aluminum, or the like. Typically, the conductive fill material 154 comprises a combination of barrier, seed, and bulk conductive materials that fill the dual-damascene opening. Excess conductive fill material can be removed using chemical-mechanical-planarization to form the dual-damascene structure shown in FIG. 15. Because the ILD 108 now comprises silicon-doped carbon material that has a relatively high modulus of elasticity as compared to CDOs (or spin-on polymers), problems related to CMP induced damage may be reduced. Moreover, because the dielectric constant of the silicon-doped carbon ILD is lower than that $SiO_2$-based dielectrics, interconnect density can be increased because crosstalk and propagation delay concerns also may be reduced. Additionally, a silicon-doped carbon ILD will have inherent advantages in terms of chemical resistance. For example, silicon-doped carbon ILDs may have a lower etch rate in HF-based cleaning solutions, thereby allowing facile removal of bottom antireflective coatings (BARC), SLAM and/or resist residues while causing minimal change to the ILD.

Processing thereafter is considered conventional to one of ordinary skill in the art. Additional layers of interconnects, ILDs, bond pad structures, etc., may be formed to fabricate a semiconductor device. Again, because the ILD 18 is mechanically stronger than that of a prior art CDO or spin-on polymer, reduced tooling and process changes may now be necessitated at various subsequent processing stages (e.g., die singulation, wafer probe, wire bond, die attach, etc.) thereby reducing overall cost and reliability of the semiconductor device.

In the various embodiments discussed herein silicon-doped carbon films, their use as an interlayer dielectric, and precursors for their formation have been disclosed. The presence of the silicon in the carbon-based film improves the silicon-doped carbon film's mechanical integrity. The relatively high carbon concentration contributes to reducing the silicon-doped carbon material's dielectric constant. Because the silicon-doped carbon film can have a higher modulus of elasticity than prior art carbon-doped oxides, it can better withstand exposure to higher compressive, tensile, and sheer forces produced during subsequent manufacturing processes

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A structure comprising:
    a plasma enhanced chemically vapor deposited silicon-doped carbon interlayer dielectric disposed over an etch stop layer;
    wherein the silicon-doped carbon interlayer dielectric has a backbone consisting essentially of hydrocarbons and silicon, and the backbone includes silicon atoms bonded to methyl groups and substantially all of the silicon atoms are bridged to each other by way of chains of alkyl groups; and
    wherein an atomic percent of silicon in the silicon-doped carbon material is less than 25 atomic percent.

2. The structure of claim 1, wherein the atomic percent of silicon in the silicon-doped carbon interlayer dielectric is less than 15 atomic percent.

3. The structure of claim 2 wherein the silicon-doped carbon interlayer dielectric has a dielectric constant in the range of approximately 2.5-2.0.

4. The structure of claim 1, wherein the atomic percent of the silicon-doped carbon interlayer dielectric is predominantly carbon.

5. The structure of claim 1, further comprising a dual-damascene interconnect including a via portion and a trench portion formed within the silicon-doped carbon interlayer dielectric.

6. A structure comprising:
    a plasma enhanced chemically vapor deposited silicon-doped carbon interlayer dielectric disposed over an etch stop layer;
    wherein the silicon-doped carbon interlayer dielectric has a backbone consisting essentially of carbon bridges between silicon atoms, and the carbon bridges include fluorinated carbon moieties; and
    wherein an atomic percent of silicon in the silicon-doped carbon material is less than 25 atomic percent.

7. The structure dielectric of claim 6, wherein the atomic percent of silicon in the silicon-doped carbon interlayer dielectric is less than 15 atomic percent.

8. The structure of claim 6, further comprising a dual-damascene interconnect including a via portion and a trench portion formed within the silicon-doped carbon interlayer dielectric.

9. The structure of claim 7, wherein the fluorinated carbon moieties are perfluorinated carbon moieties.

* * * * *